US010566938B1

(12) United States Patent
Schultz et al.

(10) Patent No.: US 10,566,938 B1
(45) Date of Patent: Feb. 18, 2020

(54) SYSTEM AND METHOD FOR PROVIDING ISOLATION OF BIAS SIGNAL FROM RF SIGNAL IN INTEGRATED CIRCUIT

(71) Applicant: NXP USA, Inc., Austin, TX (US)

(72) Inventors: Joseph Gerard Schultz, Wheaton, IL (US); Yu-Ting David Wu, Schaumburg, IL (US); Nick Yang, Wilmette, IL (US)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 16/215,877

(22) Filed: Dec. 11, 2018

(51) Int. Cl.
*H04B 1/48* (2006.01)
*H03F 3/195* (2006.01)
*H01L 27/092* (2006.01)
*H01L 27/06* (2006.01)
*H03F 3/193* (2006.01)

(52) U.S. Cl.
CPC ......... *H03F 3/195* (2013.01); *H01L 27/0629* (2013.01); *H01L 27/0922* (2013.01); *H03F 3/193* (2013.01)

(58) Field of Classification Search
CPC .. H04B 1/18; H04B 1/48; H03F 3/193; H03F 3/195; H03F 1/26; H03F 2200/181; H01L 27/629; H01L 27/0922
See application file for complete search history.

(56) References Cited

U.S. PATENT DOCUMENTS

| 6,326,849 | B1 | 12/2001 | Wang et al. | |
|---|---|---|---|---|
| 6,762,368 | B2 | 7/2004 | Saputro et al. | |
| 7,705,450 | B2 | 4/2010 | Vinson et al. | |
| 10,069,462 | B1 | 9/2018 | Min et al. | |
| 10,135,407 | B1* | 11/2018 | Chin | H03F 3/193 |
| 2002/0118076 | A1* | 8/2002 | Sharpe | H01P 1/15 333/104 |
| 2010/0188169 | A1* | 7/2010 | Hossain | H04B 1/18 333/175 |
| 2014/0354350 | A1* | 12/2014 | Bowers | H03F 3/195 327/564 |
| 2016/0373085 | A1* | 12/2016 | Barbieri | H01L 23/13 |

* cited by examiner

*Primary Examiner* — Thanh C Le

(57) ABSTRACT

Systems for providing isolation of a bias signal relative to a radio frequency (RF) signal in an integrated circuit, and related circuits, modules, and methods, are disclosed herein. In one example embodiment, a system includes an inductor, a bypass capacitor, and a transmission line segment, which includes first and second ends and extends between the first and second ends. The first end is at least indirectly coupled to the bypass capacitor, the second end is at least indirectly coupled to a first additional end of the inductor, and a second additional end of the inductor is configured to be coupled at least indirectly to a device through which the RF signal is being communicated. The transmission line segment is configured to impart a non-negligible phase shift to a signal communicated between the first and second ends, or is configured to have a non-negligible effective inductance.

20 Claims, 7 Drawing Sheets

SYSTEM AND METHOD FOR PROVIDING ISOLATION OF BIAS SIGNAL FROM RF SIGNAL IN INTEGRATED CIRCUIT

CROSS-REFERENCE TO RELATED APPLICATIONS

--

STATEMENT REGARDING FEDERALLY SPONSORED RESEARCH OR DEVELOPMENT

--

FIELD OF THE DISCLOSURE

The present disclosure relates to integrated circuits and, more particularly, to systems and methods for isolating bias signals from radio frequency (RF) signals in such integrated circuits.

BACKGROUND OF THE DISCLOSURE

A variety of integrated circuits (ICs) including, for example, RF power amplifier (PA) ICs, employ on-chip capacitors and inductors to isolate bias signals (e.g., a DC biasing signal) from other signals (e.g., a RF signal). Although such capacitors and inductors can provide significant levels of isolation, such capacitors and inductors also tend to be physically large components that tend to increase IC size, complicate signal routing, and require many vias extending through the semiconductor substrate of the IC (through-substrate vias). The presence of significant numbers of through-substrate vias can additionally be disadvantageous insofar as they can increase the risk of die cracking.

One increasingly important application for RF PA ICs is in the context of massive multiple input multiple output (mMIMO) front-end modules. The complexity of such front-end modules is increasing and the packaging size for such front-end modules is decreasing. Given such concerns, the implementation of conventional systems employing capacitors and inductors for the purpose of isolating bias signals from other signals is becoming increasingly difficult and at-odds with ongoing development of such front-end modules.

For at least these reasons, therefore, it would be advantageous if one or more improved systems and/or methods for isolating bias signals (e.g., DC bias signals) from other signals (e.g., RF signals) in integrated circuits, and/or one or more improved integrated circuits and/or related methods employing such improved systems and/or methods, could be developed that addressed one or more of the above-discussed concerns or one or more other concerns, and/or provided one or more other advantages.

DETAILED DESCRIPTION

Figure 1:
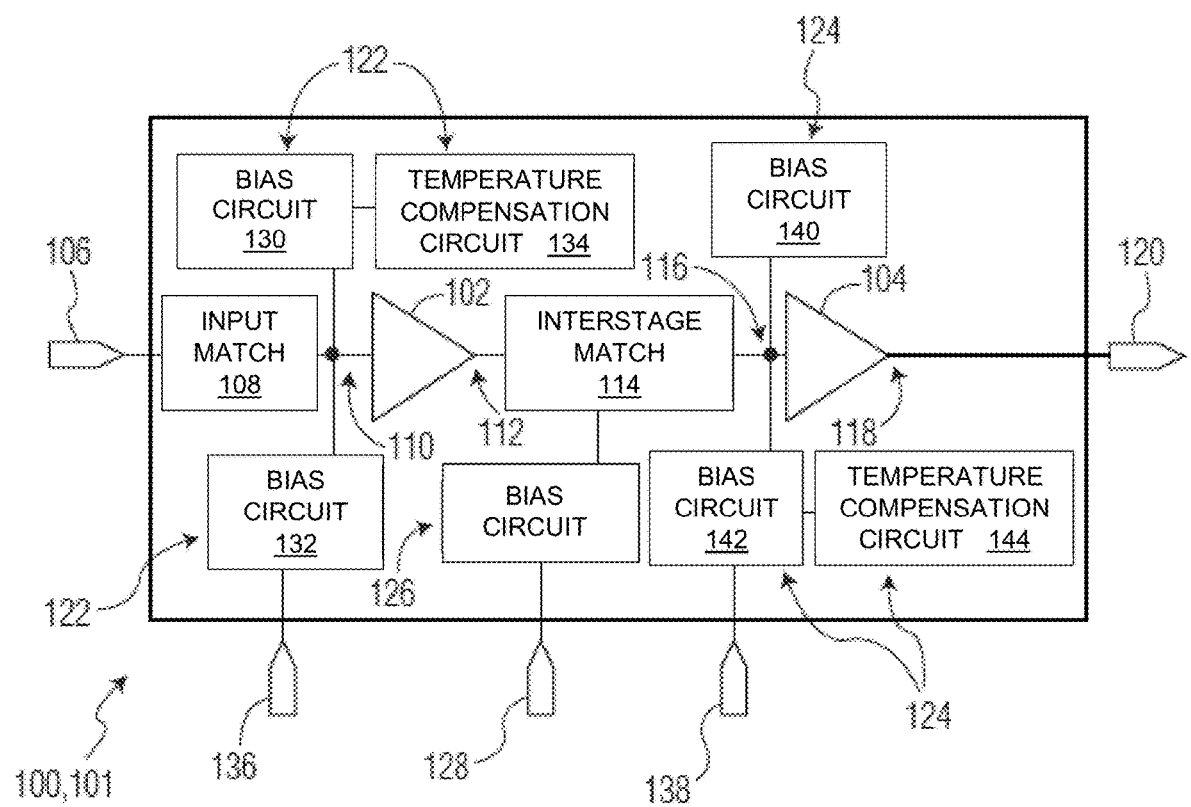
FIG. 1 is a block diagram illustrating a two-stage radio frequency integrated circuit (RFIC) power amplifier in accordance with an example embodiment encompassed herein.

Referring to FIG. 1, a block diagram 100 is provided to show in schematic form a two-stage radio frequency integrated circuit (RFIC) power amplifier system (or simply power amplifier) 101 in accordance with an example embodiment encompassed by the present disclosure. In the present example embodiment, the power amplifier 101 includes a first amplification device 102 (e.g., a pre-amplifier power transistor) that is a first field effect transistor (FET) and a second amplification device 104 (e.g., a final-stage amplifier power transistor) that is a second FET. Each FET 102, 104 includes a gate terminal (or input terminal), a drain terminal (or output terminal), and a source terminal, which is electrically coupled to a ground node (e.g., on the bottom of the RFIC). Although each of the first and second amplification devices 102 and 104 are FETs in the present embodiment, in other embodiments encompassed herein other amplification devices can be employed including, for example, other types of transistor devices such as bipolar junction transistors (BJTs). Thus, although the FET terms "gate," "drain," and "source" are used herein, the use of such terms is not meant to limit embodiments only to those that utilize FETs for amplification devices 102, 104.

Further as shown, the signal that is to be amplified by the power amplifier 101 is a radio frequency (RF) input signal ("RF IN") that is supplied to the power amplifier at a RF input port 106. Upon the RF input signal being received at the RF input port 106, that signal is provided to an input impedance matching circuit 108 that is coupled between the input port and a first input terminal 110 (gate terminal) of the first amplification device 102. The input impedance matching circuit 108 modifies the RF input signal to generate a modified RF input signal that is communicated from the input matching circuitry 108 to the first input terminal 110. In addition, the first amplification device 102 also includes a first output terminal 112 (drain terminal). By virtue of operation of the first amplification device 102, the modified RF input signal received at the first input terminal 110 is amplified to generate a first amplified output signal that is output at the first output terminal 112.

Additionally as shown, the first output terminal 112 of the first amplification device 102 is coupled to an interstage impedance matching circuit 114, which is coupled between that first output terminal 112 and a second input terminal 116 (gate terminal) of the second amplification device 104. By virtue of this arrangement, the interstage impedance matching circuit 114 modifies the first amplified output signal provided by the first amplification device 102 at the first output terminal 112 to generate an additional RF input signal that is communicated to the second input terminal 116. Upon the second amplification device 104 receiving the additional RF input signal, that amplification device further amplifies that signal and generates a second amplified output signal that is an RF output signal, which is output at a second output terminal 118 (drain terminal) of the second amplification device 104. As illustrated, the second output terminal 118 is directly coupled to (or itself forms) a RF output port 120 of the power amplifier 101, and the RF output signal ("RF OUT") generated by the second amplification device 104 accordingly can be output from the power amplifier 101 at that output port. A direct current (DC) drain bias voltage, $V_{dd2}$, may be provided to the output terminal 118 of the second amplifier through the RF output port 120 of FIG. 1.

In addition to the above-discussed components, the power amplifier 101 also includes several further components that are employed to bias the first and second amplification devices 102 and 104, that is, to provide DC gate and drain bias signals to the first and second amplification devices. More particularly in this regard, the power amplifier 101 includes a first gate biasing circuit arrangement 122 that is coupled to the first input terminal 110 of the first amplification device 102 and provides a first DC gate bias signal, $V_{gg1}$, to the first input terminal, and also a second gate biasing circuit arrangement 124 that is coupled to the second input terminal 116 of the second amplification device 104 and provides a second DC gate bias signal, $V_{gg2}$, to the second input terminal 116 of the second amplification device 104. In addition to the first and second gate biasing circuit arrangements 122 and 124, the power amplifier 101 also includes a drain bias circuit 126 that is coupled in series between the interstage matching circuit 114 and a first power input port 128, at which a drain bias voltage, $V_{dd1}$, is applied.

More particularly, with respect to the first and second biasing circuit arrangements 122 and 124, in the present example embodiment, each of these biasing circuit arrangements include three sub-circuits. The first biasing circuit arrangement 122 particularly includes a first (or "left") gate bias circuit 130, a second (or "right") gate bias circuit 132, and a first temperature compensation circuit (or first temperature compensation isolation circuit) 134. As illustrated, the first gate bias circuit 130 is coupled in series between the first temperature compensation circuit 134 and the first input terminal 110 of the first amplification device 102, and the second gate bias circuit 132 is coupled in series between that first input terminal and a second power input port 136, at which a DC bias voltage $V_{gg1}$ is provided. Because the first biasing circuit arrangement 122 includes both the first and second gate bias circuits 130 and 132, the first biasing circuit arrangement can be considered a balanced biasing circuit arrangement. This is in contrast to some alternate embodiments, also encompassed herein, in which only a single gate bias circuit is employed as part of the first biasing circuit arrangement and is implemented on only a single side of the first amplification device (e.g., for example, in the position of the first gate bias circuit 130). According to an embodiment, each gate bias circuit 130, 132 (and also gate bias circuits 140, 142) is an inductor-capacitor (LC) circuit that includes one or more bypass (or shunt) capacitor(s) coupled between a bias input terminal and a ground reference node, and one or more inductors coupled between the capacitor(s) and the input terminal (gate terminal) of an amplification device (FET). It will be appreciated that, in a balanced biasing circuit arrangement having two halves of an overall bias circuit, there is only about half the inductance that would be present if only one half of the overall bias circuit was present (although there are two inductors, the inductors are coupled in parallel, such that there is only half the inductance), but additionally there is twice the capacitance that would be present if only one half of the overall bias circuit was present (the two capacitors, coupled in parallel, result in twice the overall capacitance).

As for the second biasing circuit arrangement 124, that biasing circuit arrangement includes a third bias circuit 140, a fourth bias circuit 142, and a second temperature compensation circuit (or temperature compensation isolation circuit) 144. In the present example embodiment, the second temperature compensation circuit is coupled not to the "left" one of the bias circuits 140 and 142, which is the third bias circuit 140, but instead is coupled to the "right" one of those bias circuits, which is the fourth bias circuit 142. As shown, the fourth bias circuit 142 particularly is coupled in series between the second temperature compensation circuit 144 and the second input terminal 116 of the second amplification device 104. Further in this embodiment, the fourth bias circuit 142 is the portion of the second biasing circuit arrangement 124 that includes a third power input port 138, at which a DC gate bias voltage, $V_{gg2}$, is provided. Thus, the fourth bias circuit also is coupled in series between the third power input port 138 and the second input terminal 116 of the second amplification device 104. As for the third bias circuit 140, that circuit additionally is coupled to the second input terminal 116 of the second amplification device 104. Given the presence of both of the third and fourth bias circuits 140 and 142, the second biasing circuit arrangement 124 again is a balanced biasing circuit although, in some alternative embodiments encompassed herein, the second biasing circuit arrangement 124 can otherwise be an unbalanced biasing circuit arrangement in which only a single bias circuit is present (e.g., in the position of the fourth bias circuit 142).

In accordance with embodiments encompassed herein, the power amplifier 101 of FIG. 1 includes at least one improved circuit that provides improved bias isolation operation with respect to the power amplifier. More particularly, because the bias signals provided to the first and second amplification devices 102 and 104 are DC bias signals, the power amplifier 101 includes one or more sub-circuits (or circuit portions) that may provide improved or enhanced DC biasing performance for one or both of the first and second amplification devices 102 and 104. In at least some embodiments encompassed herein, such sub-circuits (or circuit portions) that allow for such improved or enhanced DC biasing performance particularly can be provided as parts of any of the first biasing circuit arrangement 122, the second biasing circuit arrangement 124, or the drain bias circuit 126. The improved DC biasing performance can entail, depending upon the embodiment, any of (a) enhanced isolation performance, or (b) equal isolation performance that is provided by way of a sub-circuit (or circuit portion) that is physically smaller than, or exhibits one or more other characteristic(s) that are superior to those of a conventional circuit (or circuit portion) providing similar isolation performance, or (c) enhanced isolation performance in combination with one or more other characteristic(s) (including, for example, reduced physical size) that are superior to those of a conventional circuits (or circuit portion).

In at least some embodiments encompassed herein, such improved DC biasing performance particularly can be achieved by introducing one or more "meander lines" between capacitive and inductive components of any of the first biasing circuit arrangement 122, the second biasing circuit arrangement 124, and/or the drain bias circuit 126. As used herein, the term "meander line" means a conductive transmission line that has a non-negligible phase shift or effective inductance, and that has an electrical length between first and second ends of the line that is sufficient to impart a non-negligible signal delay to a signal carried through the transmission line. It should be appreciated that a transmission line having an impedance that is significantly higher than a node impedance has the same Smith Chart movement as an inductor and, therefore, due to the non-negligible inductance of a "meander line" as discussed above, a "meander line" also may be considered an inductive element or component. In some embodiments, a "meander line" has multiple parallel-oriented, electrically-coupled, and electromagnetically-coupled transmission line segments between first and second ends of the meander line. Also, in at least some embodiments encompassed herein, such improved performance additionally can be achieved by modifying location(s) of tap point(s) (or connection nodes) of other sub-circuit(s) relative to inductive and capacitive components of the first biasing circuit arrangement 122, the second biasing circuit arrangement 124, and/or the drain bias circuit 126. As used herein, the term "tap point" means a specific physical intersection point between two radio frequency circuit components or a combination of radio frequency circuit components arranged as a sub-circuit (e.g., in the context of RF circuits, a tap point can be considered a RF connection point or RF circuit intersection point). In this sense, the term "tap point" can be contrasted with the term "node," insofar as a "node" need not refer to a specific physical location as does the term "tap point," but rather can refer to a larger or non-localized region such as the entire length of an ideal wire having zero resistance. As will be described in further detail below, in one example embodiment it is the first biasing circuit arrangement 122 that includes such a meander line as well as a modified tap point. Nevertheless, in other embodiments also encompassed herein, one or more meander line(s) and/or one or more modified tap point(s) can be included in one or more of the second biasing circuit arrangement 124 and/or the drain bias circuit 126 in addition to, or instead of, the first biasing circuit arrangement 122.

Figure 2:
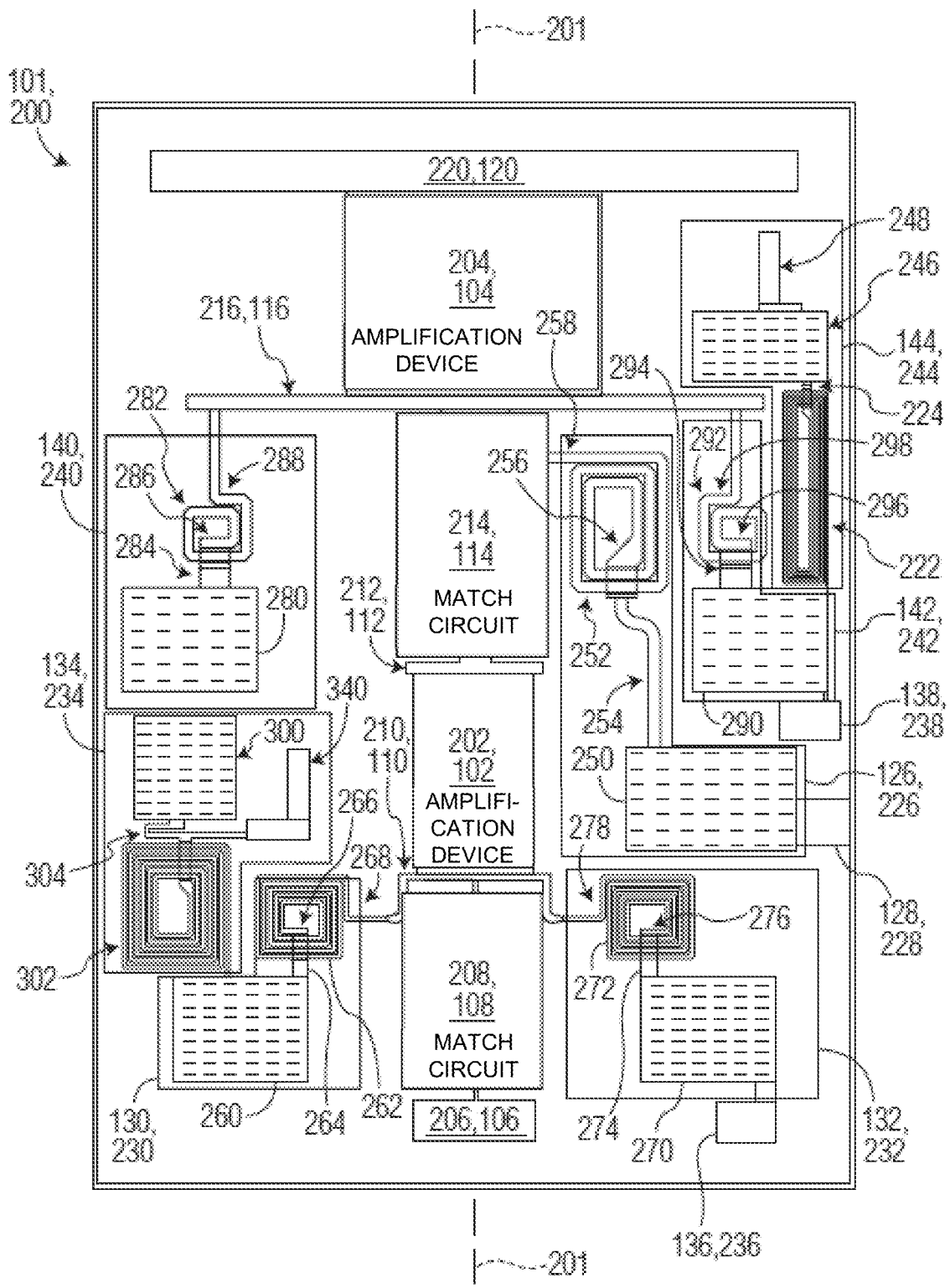
FIG. 2 is a layout diagram showing the two-stage RFIC power amplifier of FIG. 1 in further detail.

Turning to FIG. 2, an additional layout diagram 200 is provided that again shows a top view of the power amplifier 101 of FIG. 1 implemented on a monolithic semiconductor die in more detail to reveal additional components (or subcomponents) of the power amplifier as shown in FIG. 1. The semiconductor die includes a base semiconductor substrate (e.g., silicon, gallium nitride, gallium arsenide, and so on) in which various doped regions are formed (e.g., drain and source regions), and a build-up structure over the base semiconductor substrate that includes a plurality of patterned conductive layers that are separated by a plurality of dielectric layers, where portions of the patterned conductive layers are electrically coupled using conductive vias. For example, the build-up structure may include patterned conductive layers designated as M1, M2, M3, M4, M5, and so on, where the lower numbered metal layers are physically closer to the base semiconductor substrate. As illustrated in the layout diagram 200, the power amplifier 101 includes each of the first amplification device (FET) 102, the second amplification device (FET) 104, the input matching circuitry 108, and the interstage matching circuitry 114 coupled in series with one another between the RF input port 106 and the RF output port 120, in a manner corresponding to what is shown in FIG. 1. The respective ports or components 106, 108, 102, 114, 104, and 120 are respectively shown to occupy respective regions 206, 208, 202, 214, 204, and 220 of the power amplifier 101 as shown in the layout diagram 200, and these regions may be generally positioned sequentially along a bisection axis 201 (e.g., a central axis) of the power amplifier 101 as also shown in the layout diagram. As used herein, the term "left" means positioned to a first side of the bisection axis 201 (e.g., on the left side in the orientation of FIG. 2), and the term "right" means positioned to an opposite, second side of the bisection axis 201 (e.g., on the right side in the orientation of FIG. 2). The region 206 corresponding to the RF input port 106 can be considered a conductive bonding pad (or simply "pad", herein), and the region 220 corresponding to the RF output port 120 can be considered a pad as well. The various pads may be exposed at the top surface of the die, and configured for attachment of wirebonds to provide electrical connections to exterior circuitry.

In addition, the layout diagram 200 further shows additional regions 226, 228, 230, 232, 234, 236, 238, 240, 242, and 244 that respectively correspond to, and within which are positioned, the drain bias circuit 126, the first power input port 128, the first gate bias circuit 130, the second gate bias circuit 132, the first temperature compensation circuit 134, the second power input port 136, the third power input port 138, the third gate bias circuit 140, the fourth gate bias circuit 142, and the second temperature compensation circuit 144, respectively, of FIG. 1. As with the regions 206 and 220, the regions 228, 236, and 238 can also respectively be considered to be first, second, and third pads, respectively, at which the respective bias voltages $V_{dd1}$, $V_{gg1}$, and $V_{gg2}$ are applied. Additionally, FIG. 2 shows several components (or subcomponents) of the drain bias circuit 126, the first, second, third, and fourth gate bias circuits 130, 132, 140, and 142, and the first and second temperature compensation circuits 134 and 144.

More particularly as shown in FIG. 2, in the present embodiment, each of the circuits 126, 130, 132, 134, 140, 142, and 144 includes a respective combination of a respective isolation circuit that generally constitutes an inductor and a respective bypass (or shunt) capacitor. For example, some or all of the below-described inductors 222, 252, 262, 272, 282, 292, 302 may be implemented as distributed "spiral" inductors formed from patterned portions of one or more conductive layers of the build-up structure over the base semiconductor substrate, where each inductor includes first and second ends and a conductive spiral structure between the first and second ends. Each of the inductors 222, 252, 262, 272, 282, 292, 302 may have an inductance value in a range of about 0.5 nanohenries (nH) to about 10 nH in an embodiment (e.g., in an embodiment in which the RFIC is a 3.5 GHz RFIC), although the inductance values may be smaller or larger depending on frequency and power level, as well. It can be additionally appreciated that, for inductors that are closer to the RF path and are employed for RF impedance matching (e.g., the inductors 282, 292, 262, 272 of FIG. 2), the inductance can be at the lower end of this range (e.g., from 0.5 nH to about 3 nH).

In addition, some or all of the below-described bypass (or shunt) capacitors may be implemented as parallel plate capacitors with first and second plates formed from substantially rectangular patterned portions of two or more conductive layers of the build-up structure over the base semiconductor substrate. For example, a lower plate may be formed from one metal layer (e.g., M4), and an upper metal plate may be formed from another metal layer (e.g., M5), with dielectric material between the two plates. The first plate of each capacitor may be electrically connected (e.g., to inductors 222, 252, 262, 272, 282, 292, 302) as described below, and the second plate of each capacitor may be electrically connected to a ground reference (e.g., at the bottom surface of power amplifier 101) with through-substrate vias (e.g., vias 301, 351, FIGS. 3A, 3B). For example, each of capacitors 246, 250, 260, 270, 280, 290, 300 may be implemented as a metal oxide semiconductor (MOS) capacitor (or "MOS CAP"), or another type of capacitor. The capacitors 246, 250, 260, 270, 280, 290, 300 may have capacitance values in a range of about 10 picofarads (pF) to about 35 pF, in an embodiment, although the capacitance values may be smaller or larger, as well. Further in this regard, the drain bias circuit 126 includes a drain capacitor 250, a drain inductor 252, and a conductive drain link 254 therebetween, which electrically connects the capacitor 250 and inductor 252. More particularly as shown, the drain capacitor 250 is coupled between the first power input port 128 (corresponding to the region 228 forming the first pad) and one end of the drain link 254, the first end 256 of the drain inductor 252 is coupled to the other end of the drain link 254, and the second end 258 of the drain inductor 252 is coupled to the interstage matching circuitry 114.

As for the first and second bias circuits 130 and 132, these respective bias circuits include first and second capacitors 260 and 270, respectively, as well as first and second inductors 262 and 272, respectively, where the first capacitor and first inductor are coupled together by a first conductive link 264, and the second capacitor and second inductor are coupled together by a second conductive link 274. Further as shown, the first capacitor 260 of the first bias circuit 130 is coupled between the first temperature compensation circuit 134 and one end of the first conductive link 264, and the first inductor 262 is coupled between the other end of the first conductive link 264 and a lead 210 that constitutes the first input terminal 110 (e.g., including the gate terminal) of the first amplification device 102. The first conductive link 264 particularly connects the capacitor 260 with a first end 266 of the first inductor 262, and a second end 268 of the inductor 262 is what is coupled directly to the conductive lead 210. By comparison, the second capacitor 270 of the second bias circuit 132 is coupled between the second power input port 136 and one end of the second conductive link 274, and the second inductor 272 is coupled between the opposite end of that conductive link 274 and the lead 210 forming the first input terminal 110. More particularly, the second conductive link 274 couples the second capacitor 270 directly with a first end 276 of the second inductor 272, and it is a second end 278 of the second inductor that is directly coupled to the lead 210.

Further, with respect to the third and fourth bias circuits 140 and 142, these respective bias circuits include third and fourth capacitors 280 and 290, respectively, as well as third and fourth inductors 282 and 292, respectively, where the third capacitor and third inductor are coupled together by a third conductive link 284, and the fourth capacitor and fourth inductor are coupled together by a fourth conductive link 294. More particularly, the third conductive link 284 couples the third capacitor 280 and a first end 286 of the third inductor 282, and it is a second end 288 of the third inductor 282 that is directly coupled to a lead 216 that constitutes the second input terminal 116 (including the gate terminal) of the second amplification device 104. Additionally, the fourth capacitor 290 is coupled between the third power input port 138 (corresponding to the region 238 forming the third pad) and one end of the fourth conductive link 294, the other end of the fourth conductive link 294 is coupled to a first end 296 of the fourth inductor 292, and a second end 298 of the fourth inductor 292 is also coupled to the lead 216 that constitutes the second input terminal 116. Also, in this embodiment, the fourth capacitor 290 not only is coupled to the conductive link 294 and the third power input port 138, but also is coupled to the second temperature compensation circuit 144.

Still referring to FIG. 2, as already discussed above, the power amplifier 101 additionally includes both the first temperature compensation circuit 134 and also the second temperature compensation circuit 144. As will be described in more detail below, embodiments of the inventive subject matter include modified bypass capacitor tap-points and feed lengths that are characterized by a relatively small parasitic inductance to create and control the resonance of the isolation circuit. The parasitic inductance is created, in some embodiments, with the addition of a relatively small meandering transmission line (referred to herein as a "meander line"). The tuned resonance may increase the isolation in the RF band and allow the size of the thermal track capacitors to be reduced, when compared with a circuit that does not include such a parasitic inductance (or meander line), and/or allow for a reduction in the number of capacitor vias.

With respect to the second temperature compensation circuit 144, which is shown in FIG. 2 as the additional region 244 of the layout diagram 200, in the present embodiment this circuit may take the illustrated form. More particularly as shown, the second temperature compensation circuit includes a fifth capacitor 246, a fifth inductor 222 and a conductive link 224 coupling the fifth capacitor to the fifth inductor (more particularly to a first end of the inductor). The fifth inductor 222 is also coupled to the fourth capacitor 290 of the fourth bias circuit 142 (more specifically, it is the second end of the inductor that is so coupled to that capacitor). The fifth inductor 222 may be considered an isolation coil, with an inductance value that is large enough to keep the RF signal conveyed through the amplifier away from the reference FET bias. For example, the fifth inductor 222 may have an inductance value in a range of about 5 nH to about 10 nH, although the inductance value may be smaller or larger, as well.

In contrast to the second temperature compensation circuit 144, the first temperature compensation circuit 134 in the present embodiment takes a different and improved form. Indeed, although each of the drain bias circuit 126, the first, second, third, and fourth bias circuits 130, 132, 140, and 142, and each of the first and second temperature compensation circuits 134 and 144 of the power amplifier 101 includes a respective combination of a respective inductor that provides inductance and a capacitor that provides capacitance, the first temperature compensation circuit 134 nevertheless includes additional features to allow for improved DC biasing performance of the power amplifier 101. More particularly, referring both to FIG. 2 and additionally to FIG. 3A, in the present example embodiment the first temperature compensation circuit 134 not only includes a sixth capacitor 300 that is coupled to the first bias circuit 130 (see FIG. 2) and a sixth inductor 302 (providing inductance), but also includes a meander line 304 that provides a conductive link between that capacitor and that inductor.

Figures 3A, 3B, 3C:
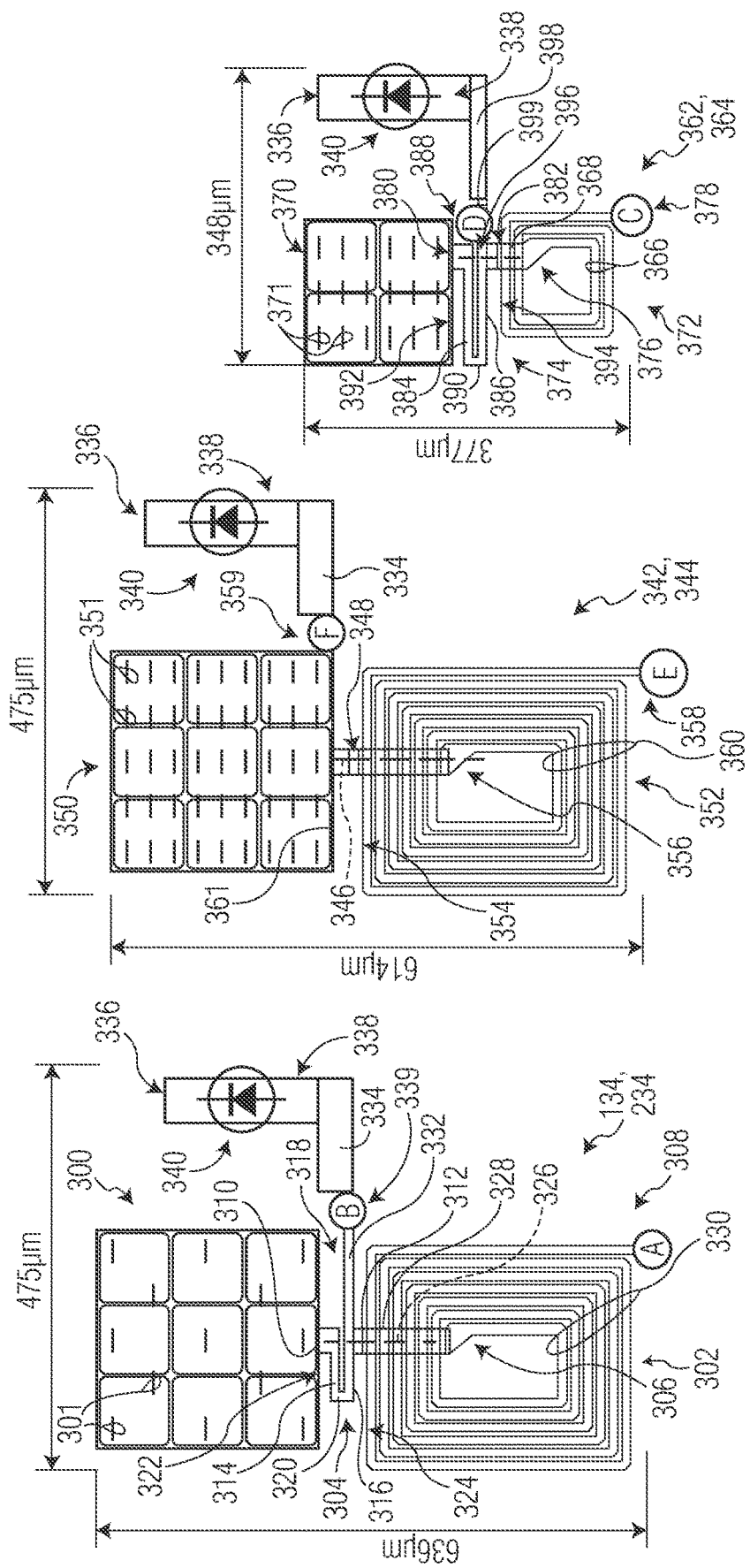
FIG. 3A is a layout diagram of a first example improved temperature compensation circuit that forms a part of a bias isolation circuit arrangement of the RFIC power amplifier of FIGS. 1 and 2.
FIG. 3B is a layout diagram of a Prior Art temperature compensation circuit, where the layout diagram is shown proximate the layout diagram of FIG. 3A to illustrate relative sizes of the circuits shown in the layout diagrams of FIG. 3A and FIG. 3B.
FIG. 3C is a layout diagram of a second example improved temperature compensation circuit that can be employed as a part of an alternate bias isolation circuit arrangement of the RFIC power amplifier of FIGS. 1 and 2 in place of the first example improved temperature compensation circuit of FIG. 3A, where the layout diagram is shown proximate the layout diagrams of FIG. 3A and FIG. 3B to illustrate relative sizes of the circuits shown in the layout diagrams.

Referring more particularly to FIG. 3A, a layout diagram is provided to show in more detail (and with some enlargement) the region 234 of FIG. 2 with which is included the first temperature compensation circuit 134. As shown in FIG. 3A, the sixth inductor 302 particularly includes a first end 306 and a second end 308, with a conductive spiral between the first and second ends 306, 308. The sixth inductor 302 may be considered an isolation coil, with an inductance value that is large enough to keep the RF signal conveyed through the amplifier away from the reference FET bias. For example, the sixth inductor 302 may have an inductance value in a range of about 5 nH to about 10 nH, although the inductance value may be smaller or larger, as well. The second end 308, labeled also as a node A, is the part of the first temperature compensation circuit 134 that is configured or arranged so as to be coupled to the first capacitor 260 of the first bias circuit 130 as shown in FIG. 2, and therefore is configured to be at least indirectly coupled with the first amplification device 102 by way of the first bias circuit 130 and the lead 210). Meander line 304 is a conductive structure that may be formed from patterned portions of one or more conductive layers of the build-up structure of the die. According to an embodiment, meander line 304 has an electrical length between first and second ends of the meander line that is sufficient to impart a non-negligible phase shift or signal delay (e.g., a phase shift between 5 and 15 degrees) to a signal carried through the meander line, where lambda is the center frequency of operation of the circuit.

In the illustrated embodiment of FIG. 3A, meander line 304 includes multiple parallel, electrically-coupled, and electromagnetically-coupled transmission line segments, and meander line 304 is characterized by an inductance value in a range of about 0.2 nanoHenries (nH) to about 0.5 nH, although the inductance could be smaller or larger, as well. Meander line 304 is coupled in series between inductor 302 and capacitor 300, and thus meander line 304 may be alternatively characterized as a "series inductive component" or a "transmission line segment." The meander line 304 as shown particularly is a U-shaped (or C-shaped) structure that has a first end 310 that is coupled to the sixth capacitor 300, a second end 312 that is coupled to the first end 306 of the inductor 302, and first and second elongated portions 314 and 316 that extend in parallel and longitudinally away from the first and second ends 310 and 312, respectively within a space 318 between the capacitor 300 and the inductor 302, and which meet up and are interconnected with one another at a far end 320 (or curved end) of the meander line 304.

Additionally as shown, in the present embodiment of FIG. 3A, both of the sixth capacitor 300 and the sixth inductor 302 are substantially rectangular structures and the space 318 is also a rectangular region positioned between a first edge 322 of the capacitor 300 that is generally facing the inductor 302 and a second edge 324 of the inductor that is generally facing the capacitor 300, where the first and second edges 322 and 324 are parallel or substantially parallel. Also, in the present embodiment, each of the first and second elongated portions 314 and 316 of the meander line 304 generally extend within the space 318 in a manner that is parallel to the edges 322 and 324 and generally perpendicular to an axis 326 extending between the ends 310 and 312. It should be appreciated that the elongated portion 314 is spaced apart from the edge 322, e.g., by a length of the first end 310, which extends inward from that edge to an interior location at which is positioned the elongated portion 314. Likewise, the elongated portion 316 is spaced apart from the edge 324, e.g., by a length of the second end 312, which extends inward from that edge to another interior location at which is positioned the elongated portion 316. Further, the elongated portions 314 and 316 are spaced apart from one another, except where the elongated portions meet at the far end 320. It should be appreciated that the first end 306 of the inductor 302 includes a bridge portion 328 that extends across (or possibly beneath) multiple spiral paths 330 of the inductor 302 so as to link up with the second end 312 of the meander line 304.

In addition to the above-discussed features, FIG. 3A also shows that the first temperature compensation circuit 134 also includes a temperature sensing device (or temperature sensitive device) 340. Although the temperature sensing device 340 is illustrated to be a diode, the temperature sensing device can take any of a variety of forms, and in the present embodiment is achieved by way of an additional FET having gate and drain terminals that are coupled together to form an input terminal 338 of the device 340. At an output terminal 336 of the temperature sensing device 340 (which in the present embodiment can be a source terminal of the FET constituting the temperature sensing device), the temperature sensing device can be coupled to ground. Also as further shown, an additional conductive link 334 couples the input terminal 338 to a tap point 339, which can be viewed as a far extension point of the meander line 304. In this regard, the second elongated portion 316 of the meander line not only extends to one side (e.g., to the left as shown in FIG. 3A) of the second end 312, parallel to the first elongated portion 314, but also includes an extension 332 that extends to the other side (e.g., to the right as shown in FIG. 3A) of the second end 312, up to the tap point (or junction) 339.

In view of the above discussion concerning the embodiment of FIG. 3A, it should be understood that the first temperature compensation circuit 134, by virtue of the meander line 304 and tap point 339, enables the overall first biasing circuit arrangement 122 including both the first temperature compensation circuit 134 and the first bias circuit 130 to achieve advantageous operation in one or more respects. In particular, as discussed further below, the first biasing circuit arrangement 122 can provide enhanced isolation of the RF signal received at the input terminal 110 of the first amplification device 102 from the input matching circuit 108, relative to the DC biasing signal provided by the first bias circuit 130 to the input terminal 110. That is, the first biasing circuit arrangement 122 can provide enhanced isolation by comparison with an alternate biasing circuit arrangement having the same or substantially the same size in terms of physical area.

To illustrate this in more detail, FIG. 3B is provided to illustrate a layout diagram 344 of an alternate temperature compensation circuit 342 that could be implemented into the power amplifier 101 in place of the temperature compensation circuit 134 shown in FIG. 3A. It will be appreciated from a comparison of FIG. 3A and FIG. 3B that the alternate temperature compensation circuit 342 resembles the improved temperature compensation circuit 134 in several respects. Among other things, as illustrated, the alternate temperature compensation circuit 342 includes a capacitor 350 that is coupled to an inductor 352, which has a first end 356 and a second end 358. In this embodiment, the inductor 352 can be similar in shape and size to the sixth inductor 302, and further the capacitor 350 can be similar in shape and size or substantially the same shape and size as the sixth capacitor 300. In particular, in FIGS. 3A and 3B, the number of spiral paths 330 in the sixth inductor 302 is identical to a number of spiral paths 360 in the inductor 352, namely, six spirals or seven spirals depending upon where one samples the spirals around the respective isolation circuits. It will be appreciated that, in general, the amount of inductance provided by any inductor will increase as the number of spiral paths of that inductor increases.

Further, in this embodiment, the capacitor 350 is also coupled with a temperature sensing device, which in the present embodiment may be identical to the temperature sensing device 340 of FIG. 3A, by way of a conductive link 334. Consequently, the overall physical area (in terms of the layout area) of the alternate temperature compensation circuit 342 is identical, substantially similar, or at least largely the same as that of the improved temperature compensation circuit 134. For example, in this example, the respective widths of the temperature compensation circuits 134 and 342 could be approximately 475 micrometers in each case, and the respective lengths of the respective temperature compensation circuits 134 could be approximately 636 micrometers for the temperature compensation circuit 134 and approximately 614 micrometers for the temperature compensation circuit 342.

Notwithstanding the above-discussed similarities, the alternate temperature compensation circuit 342 differs from the improved temperature compensation circuit 134 in numerous respects. First, in the alternate temperature compensation circuit 342, the first end 356 of the inductor 352 is not coupled to the capacitor 350 by way of any meander line or series inductive element as is present in the temperature compensation circuit 134. Rather, the first end 356 of the inductor 352 is coupled to the capacitor 350 by way of a straight conductive link 348 with negligible inductance that follows a direction parallel to an axis 346, which is perpendicular to a first edge 361 of the capacitor 350 and a second edge 354 of the inductor 352 (which respectively correspond in location to the first edge 322 and second edge 324 of the capacitor 300 and inductor 302, respectively). In particular, the conductive link 348 does not follow a U-shaped path in the manner of the meander line 304 and entirely lacks any elongated portions that extend parallel to the edges 361 and 354 of the capacitor 350 and inductor 352.

In addition, the alternate temperature compensation circuit 342 also differs from the temperature compensation circuit 134 of FIG. 3A in that the conductive link 334 to the temperature sensing device 340 is not coupled to the conductive link 348 or any portion thereof, but rather is coupled to a location 359 on the capacitor 350 (e.g., a location on the edge of the upper plate of capacitor 350). As shown, the location 359 is positioned apart from, and on a different edge of the capacitor 350 than, the first edge 361 of the capacitor with respect to which the conductive link 348 is coupled.

As already discussed, in view of the differences between the improved temperature compensation circuit 134 of FIG. 3A and the alternate temperature compensation circuit 342 of FIG. 3B, the improved temperature compensation circuit 134 of FIG. 3A may offer substantially better performance than that offered by the alternate temperature compensation circuit 342. Not only is the improved temperature compensation circuit 134 potentially able to provide better, enhanced isolation by comparison with that provided by the alternate temperature compensation circuit 342, but also the improved temperature compensation circuit may be able to provide such superior isolation even though both of the temperature compensation circuits occupy substantially the same physical layout area.

In addition, such improved bias isolation performance can be achieved by way of the improved temperature compensation circuit 134 of FIG. 3A even when the capacitor 300 of that circuit has a substantially reduced number of through-substrate-vias (TSVs) connecting the lower plate of capacitor 300 to the ground reference by comparison with the number of TSVs connecting the lower plate of capacitor 350 of the alternate temperature compensation circuit 342 of FIG. 3B to the ground reference. For example, as shown in FIG. 3A, the capacitor 300 is coupled to the ground reference using only thirteen (13) TSVs 301 arranged as in a combination of a 3×3 matrix and a 2×2 matrix embedded therein, but the capacitor 350 of FIG. 3B is coupled to the ground reference using 45 TSVs 351 arranged in a 5×9 matrix. The presence of a reduced number of TSVs in the improved temperature compensation circuit 134 of FIG. 3A may offer improved performance relative to the temperature compensation circuit 342, particularly in terms of the avoidance of excessive additional inductances arising from the more numerous TSVs coupling the capacitor 300 to the ground reference. It should be appreciated that TSVs are parallel metalized connections between the lower (e.g., M4) plate of the capacitor (e.g., the capacitor 300) and ground (e.g., the IC ground), and that the number of TSVs coupling a capacitor to ground is inversely proportional to the parasitic inductance of the capacitor, and further that, as the number of TSVs is reduced, this effectively increases the parasitic inductance created by the capacitor. In at least some embodiments, each of the TSVs associated with a given capacitor can have the same inductance associated with it, $L_{TSV}$, and all of the TSVs associated with that capacitor (which are coupled in parallel with one another) form a total equivalent inductance, namely, $L_{TSV}$ divided by the total number of TSVs that are present.

Notwithstanding that the example improved temperature compensation circuit 134 of FIG. 3A may be substantially the same size in physical area as the alternate temperature compensation circuit 342 of FIG. 3B, this need not be the case in all embodiments. To the contrary, the present disclosure also envisions embodiments involving or employing improved temperature compensation circuits that take forms that are physically substantially smaller, including for example the form of an improved temperature compensation circuit 362, a layout diagram 364 of which is shown in FIG. 3C. As shown by a comparison of FIG. 3C with FIG. 3A, the improved temperature compensation circuit 362 is similar to the improved temperature compensation circuit 134 in that the temperature compensation circuit 362 again includes a capacitor 370 and an inductor 372 having a first end 376 and a second end 378 with a spiral inductor coupled between them, where the capacitor 370 and inductor 372 are coupled together by way of a meander line 374 that constitutes a conductive link between those two components. The meander line 374 again particularly connects a first end 380 along an edge of a first plate (e.g., an upper plate) of the capacitor 370 and a second end 382 which is coupled to an end of the inductor 372. The second end 382 particularly is coupled to the first end 376 of the inductor 372 by way of a bridge segment 368 (i.e., a conductive connection) that bridges over (or possibly under) spiral paths 366 of the inductor 372.

Additionally, in a manner similar to that of the improved temperature compensation circuit 134, the meander line 374 of the improved temperature compensation circuit 362 includes first and second elongated portions 384 and 386, respectively, which extend within a space 388 between the capacitor 370 and the inductor 372. The first and second elongated portions 384 and 386 respectively extend between the first and second ends 380 and 382, respectively, up to a far end (or end portion) 390, at which the two elongated portions are electrically coupled with a curved portion. As shown in FIG. 3C, the elongated portions 384 and 386 particularly extend in a manner parallel to one another and parallel to each of a first edge 392 of the capacitor 370 and a second edge 394 of the inductor that respectively face one another and face a space 388 between the capacitor and inductor. The direction along which the elongated portions 384 and 386 each extend is substantially perpendicular to an axis 396 that links the first and second ends 380 and 382.

In addition, the meander line 374 of the improved temperature compensation circuit 362 additionally includes an extension corresponding to the extension 332 of FIG. 3A between the second end 382 and a tap point 399 (this extension is much shorter than the extension 332, in this embodiment, and is not labeled). Further as shown, the input terminal 338 of the temperature sensing device 340 (which again, in this embodiment, may be a diode-connected FET having both that input terminal and the output terminal 336 discussed above) is coupled to the tap point 399 by way of an additional conductive link 398.

Although the improved temperature compensation circuits 134 and 362 are similar to one another in the above-described respects, and particularly both include meander lines (304 and 374) and tap points along extensions of those meander lines (339 and 399), the improved temperature compensation circuit 362 differs from the improved temperature compensation circuit 134 in certain respects (in addition to the length of the extension 332 of the circuit 134 being significantly longer than the corresponding extension of the circuit 362). More particularly as shown in FIG. 3C, the width of the temperature compensation circuit 362 is approximately 348 micrometers, which is substantially less than that of the temperature compensation circuit 134 of FIG. 3A. Also, the length of the improved temperature compensation circuit 362 is approximately 377 micrometers, which is substantially less than the approximate 636 micrometer length of the temperature compensation circuit 134 of FIG. 3A. Thus, the physical space taken up by the improved temperature compensation circuit 362 (in terms of area on an integrated circuit) is much less than that of the improved temperature compensation circuit 134. Additionally, it can be also noted that the capacitor 370 of the improved temperature compensation circuit 362 of FIG. 3C is electrically coupled to the ground reference using eighteen (18) TSVs 371 instead of the lesser number (13) of the TSVs 301 that electrically connect the improved temperature compensation circuit 134 of FIG. 3A to the ground reference.

Nevertheless, even though the improved temperature compensation circuit 362 of FIG. 3C is substantially smaller than the improved temperature compensation circuit 134 of FIG. 3A, the isolation provided by a biasing circuit arrangement employing the improved temperature compensation circuit 362 (e.g., a modified version of the first biasing circuit arrangement 122 employing the circuit 362 instead of the circuit 134) may be equal or substantially equal to that which would be provided the alternate temperature compensation circuit 342 of FIG. 3B, even though the circuit 362 has a physical area that is much smaller than that of the circuit 342. That is, a modified version of the first biasing circuit arrangement 122 employing the improved temperature compensation circuit 362 would allow for the isolation of the RF signal received at the input terminal 110 of the first amplification device 102 from the input matching circuit 108, relative to the DC biasing signal provided by the first bias circuit 130 to the input terminal 110, to be equal or substantially equal to the isolation that would be achieved if the first biasing circuit arrangement 122 was modified to employ the alternate temperature compensation circuit 342. From this vantage point, therefore, the improved temperature compensation circuit 362 can achieve enhanced or advantageous operation by comparison with the alternate temperature compensation circuit 342 insofar as the same or substantially the same isolation can be achieved by a circuit taking up much less physical area than would otherwise be utilized.

It should be appreciated from the above description that the second temperature compensation circuit 144 of FIG. 2 resembles the alternate temperature compensation circuit 342 of FIG. 3B. Although the fifth capacitor 246 has a somewhat different rectangular shape than the capacitor 350 and the fifth inductor 222 has a shape that is more elongated than that of the inductor 352, the conductive link 224 between those two components of the second temperature compensation circuit 144 does not take the form of any meander line such as those shown and described above in relation to FIG. 3A and FIG. 3C. Also, in contrast to the embodiments shown in FIG. 3A and FIG. 3C in which tap points are situated along extensions of such meander lines, a structure 248 in the second temperature compensation circuit 144 corresponding to the assembly of the temperature sensing device 340 and conductive link 334 of the alternate temperature compensation circuit 342 of FIG. 3B is again coupled directly to an edge of a plate of the capacitor 246 that is apart from the conductive link 224 and the edge of a plate of that capacitor to which that conductive link is coupled. In view of this, it should be appreciated that the second temperature compensation circuit 144 shown in FIG. 2 is another alternate temperature compensation circuit that is a significantly modified version of the alternate temperature circuit 342 of FIG. 3B.

Nevertheless, in other embodiments, the second temperature compensation circuit 144 can take other forms. For example, in at least some other embodiments, the second temperature compensation circuit employed as part of the second biasing circuit arrangement 124 can take the form of one or another of the improved temperature compensation circuits 134 and 362 of FIG. 3A or FIG. 3C, or possibly other improved temperature compensation circuits encompassed herein. That is, in at least some other embodiments, the second temperature compensation circuit 144 can take the form of a temperature compensation circuit employing a meander line as a substantial part of the conductive link between the inductor and capacitor of that circuit, as well as a modified tap point along such meander line at which a temperature sensing device (or another circuit portion or assembly) can be coupled.

Further, in other embodiments encompassed herein, any one or more of the first, second, third, and fourth gate bias circuits 130, 132, 140, and 142, as well as the drain bias circuit 126, can take the form of, or substantially the form of, one of the improved circuits shown in FIG. 3A or FIG. 3C or another improved circuit that employs a meander line-type conductive link and modified tap point between the inductor and the capacitor of the respective circuit. That is, in other embodiments encompassed herein, any of the first, second, third, and fourth gate bias circuits 130, 132, 140, and 142, and/or the drain bias circuit 126 can employ a meander line type conductive link in place of any one or more of the conductive links 264, 274, 284, 294, and 254, respectively.

Further, in additional embodiments encompassed herein in which one or more of the circuits 130, 132, 140, 142, 126, and 144 takes the form of, or substantially the form of, one of the improved temperature compensation circuits 134 or 362 of FIG. 3A or FIG. 3C in which a meander line-type conductive link and modified tap point are employed, the first temperature compensation circuit 134 can instead take an alternative form. For example, in some such embodiments, the first temperature compensation circuit 134 can be replaced with a temperature compensation circuit that is of an alternate form, such as the alternate temperature compensation circuit 342.

Figure 4C:
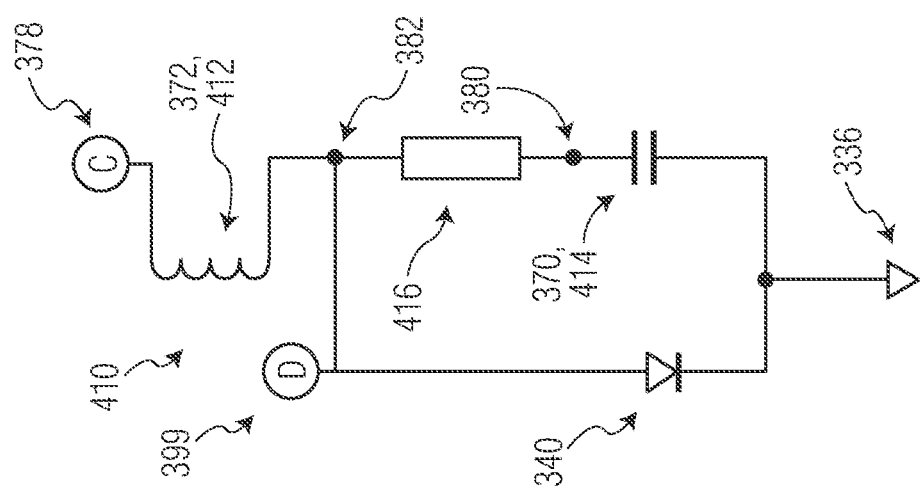
FIG. 4A, FIG. 4B, and FIG. 4C are respectively first, second, and third equivalent circuit schematic diagrams representative of the temperature compensation circuits of FIG. 3A, FIG. 3B, and FIG. 3C, respectively.
Figure 4B:
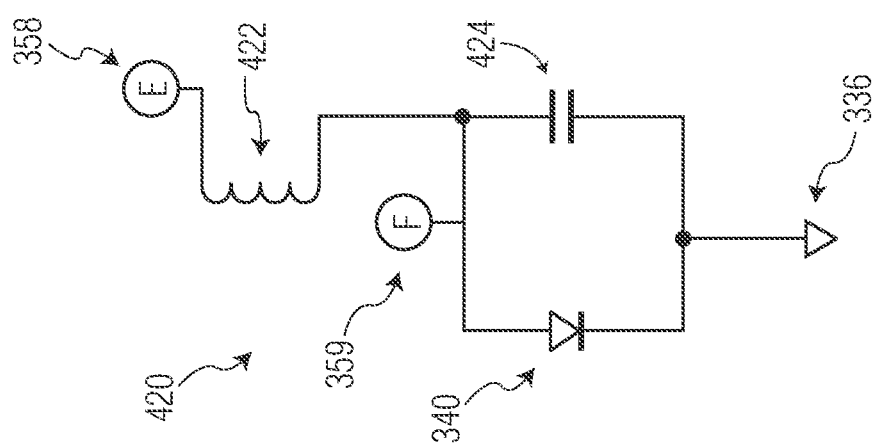
Figure 4A:
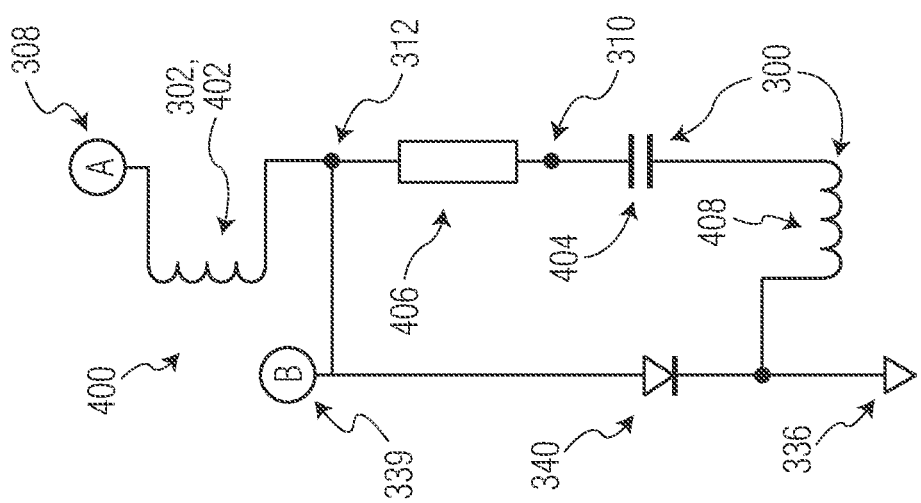

Referring additionally to FIG. 4A, FIG. 4B, and FIG. 4C, first, second, and third schematic circuit diagrams 400, 420, and 410 respectively are provided that correspond respectively to the temperature compensation circuits 134, 342, and 362 of FIG. 3A, FIG. 3B, and FIG. 3C, respectively. By virtue of the representations provided in FIG. 4A, FIG. 4B, and FIG. 4C, it can be additionally appreciated why the improved temperature compensation circuits 134 and 362 of FIG. 3A and FIG. 3C perform differently, and in an improved manner relative to, the alternate temperature compensation circuit 342 of FIG. 3B.

More particularly as shown in FIG. 4A, the improved temperature compensation circuit 134 of FIG. 3A can be represented electrically by the first schematic diagram 400 that includes an inductor 402, a capacitor 404, a transmission line segment 406, an additional inductor 408, and a diode corresponding to the temperature sensing device 340. As illustrated, the inductor 402 is coupled between a node (or terminal) A corresponding to the second end 308 of the inductor 302, and a node B corresponding to the tap point 339 in FIG. 3A. The inductor 402 therefore is intended to be representative of the inductor 302 and particularly the inductance provided by that inductor. Additionally, the transmission line 406 is coupled between the node B corresponding to the tap point 339 and a node corresponding to the first end 310 of meander line 304, which as described above in regard to FIG. 3A is the junction between the meander line 304 and the capacitor 300. Accordingly, the transmission line 406 is intended to be representative of the transmission line effects of the meander line 304 between the first end 310 and the second end 312 of meander line 304. Additionally from this description, it should be appreciated that the tap point 339 can be considered to be one and the same node as the second end 312 of the meander line 304, which is coupled to the inductor 302.

Further, the schematic diagram 400 includes a capacitor 404 and an additional inductor 408 coupled in series between the first end 310 and an output terminal 336 that corresponds to the ground terminal shown in FIG. 3A. The capacitor 404 is intended to be representative of the capacitor 300 and the capacitance provided thereby, and the additional inductor 408 is intended to be representative of the inductance created by the TSVs 301 of the capacitor 300. For this reason, the combination of the capacitor 404 and the additional inductor 408 are collectively labeled as the capacitor 300. Finally, FIG. 4A also shows the temperature sensing device 340, which again in the present example is shown to be a diode, between the node B corresponding to the tap point 339 and the output terminal 336. For purposes of the present description, it will be appreciated that the additional conductive link 334 shown in FIG. 3A is viewed as having negligible electrical effects and thus that the tap point 339 can be considered to constitute electrically the same node as the input terminal 338 as well as the second end 312.

As already described above, the second temperature compensation circuit 362 of FIG. 3C has components that correspond to those of the circuit 134 of FIG. 3A. Therefore, notwithstanding the size differential between the two circuits, the third schematic diagram 410 corresponding to the improved temperature compensation circuit 362 in FIG. 4C is similar to the first schematic diagram 400 shown in FIG. 4A. More particularly, the schematic diagram 410 of FIG. 4C represents the second improved temperature compensation circuit 362 as including an inductor 412, a capacitor 414, a transmission line 416, and a diode corresponding to the temperature sensing device 340. As illustrated, the inductor 412 is coupled between a node (or terminal) C corresponding to the second end 378 of the inductor 372, and a node D corresponding to the tap point 399 in FIG. 3C. The inductor 412 therefore is intended to be representative of the inductor 372 and particularly the inductance provided by that inductor. Additionally, the transmission line 416 is coupled between the node D corresponding to the tap point 399 and a node corresponding to the first end 380, which as described above in regard to FIG. 3C is the junction between the meander line 374 and the capacitor 370. Accordingly, the transmission line 416 is intended to be representative of the transmission line effects of the meander line 374 between the first end 380 and the second end 382 of the meander line 374. Additionally from this description, it should be appreciated that the tap point 399 can be considered to be one and the same node as the second end 382 of the meander line 374, which is coupled to the inductor 372.

Further, the schematic diagram 410 includes the capacitor 414 that is representative of the capacitance provided by the capacitor 370, where the capacitor is coupled in series between the first end 380 and the output terminal 336, as well as the temperature sensing device 340 coupled between the node D (the tap point 399) and the output terminal 336. In this example embodiment, the capacitor 370 can be represented solely by way of the capacitor 414, and an additional inductance corresponding to the additional inductance 408 of FIG. 4A is not included. Also, similar to the schematic diagram 400 of FIG. 4A, the conductive link 398 of the temperature compensation circuit 362 is viewed as having zero electrical significance such that the tap point 399 is viewed as being the same node as the input terminal 338 shown in FIG. 3C (and also, as already noted, the tap point 399 is considered to be one and the same node as the second end 382).

By contrast, the second schematic diagram shown in FIG. 4B shows that the alternate temperature compensation circuit 342 has substantially different electrical properties relative to the improved temperature compensation circuits 134 and 362 of FIG. 3A and FIG. 3C. As represented by the schematic diagram 420, the alternate temperature compensation circuit 342 can be represented simply by an inductor 422 coupled in series with a capacitor 424 between the node E corresponding to the second end 358 of the inductor 352 and the output terminal 336, along with the temperature sensing device 340 being coupled between the output terminal 336 and the junction between the inductor 422 and the capacitor 424. In this schematic 420, the capacitor 424 can be understood to be representative of the capacitor 350 and the inductor 422 can be understood to be representative of the inductor 352.

In this illustration, the straight conductive link 348 between the capacitor 350 and the inductor 352 is viewed as a short circuit, as is the additional conductive link 334, because both conductive links 334, 348 have negligible electrical properties (e.g., negligible inductance). Also, the entire (including both ends of the) straight conductive link 348 and the location (or tap point) 359, shown also as node F, are considered to be short circuited with one another. Consequently, the junction between the capacitor 424 and the inductor 422 is considered to be the same node, electrically, as each of the entire (including both ends of) the straight conductive link 348, the location 359 (node F), and the input terminal 338 of the temperature sensing device 340. Of particular significance, in terms of contrasting the schematic diagram 420 of FIG. 4B with the schematic diagrams 400 and 410 of FIG. 4A and FIG. 4C, is the difference that the schematic diagram 420 lacks any transmission line component corresponding to either of the transmission lines 406 and 416. Consequently, in FIG. 4B (and in contrast to each of FIG. 4A and FIG. 4C), both the location 359 and the inductor 422 are coupled directly to the capacitor 350 without any intermediate transmission line.

Figure 5:
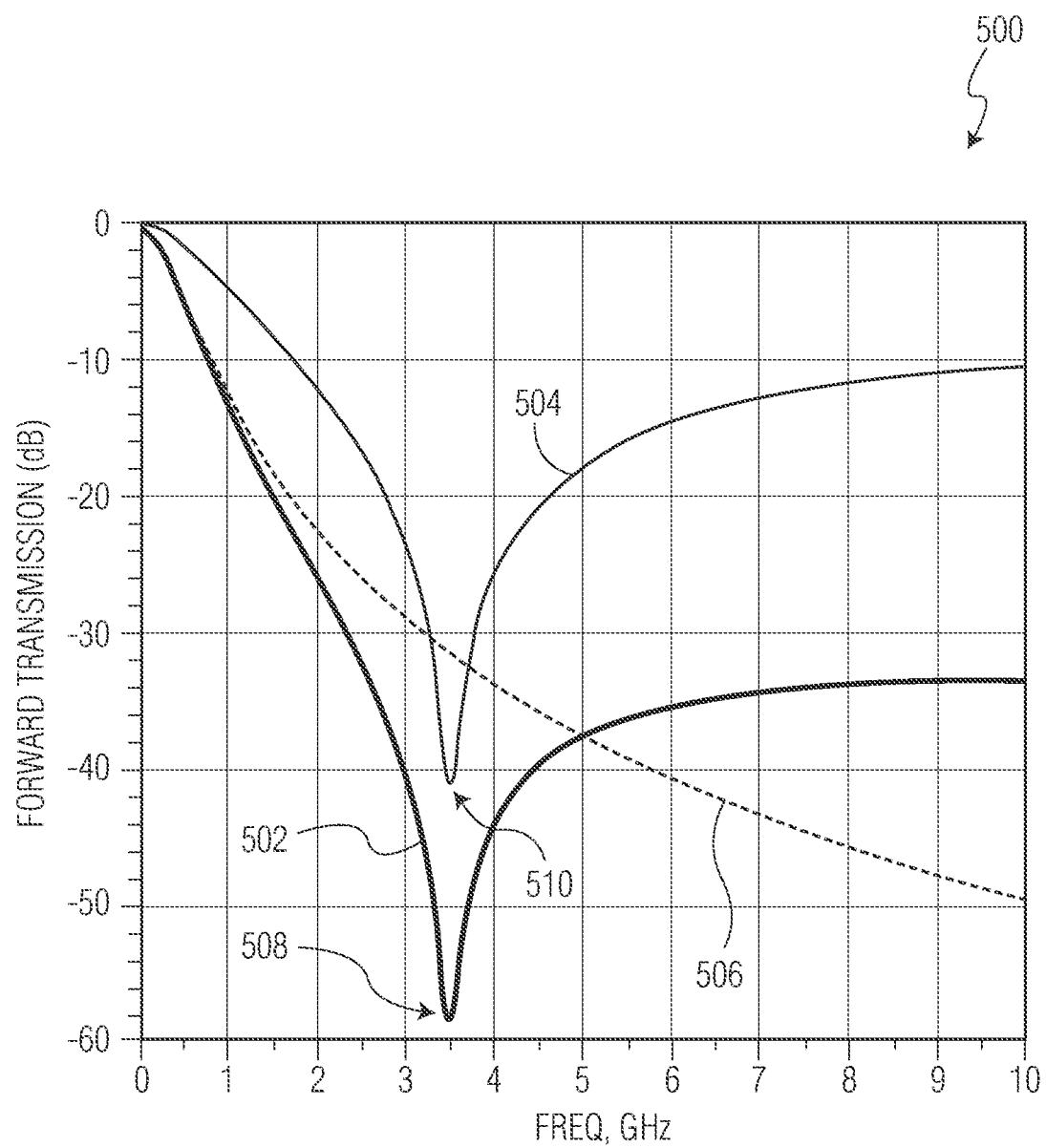
FIG. 5 is a graph illustrating isolation level (in dB) relative to signal frequency (in GHz) as provided during operation by each of the bias isolation circuits of each of FIG. 3A, FIG. 3B, and FIG. 3C.

Turning to FIG. 5, given the differences between the schematic diagrams 400, 410, and 420 representing the differences between the temperature compensation circuits 134, 362, and 342, respectively, the operational performance exhibited by a biasing circuit arrangement (such as the biasing circuit arrangement 122 of FIG. 2) employing each of the three different circuits as a function of frequency is different. More particularly, the manners of isolation behavior exhibited by biasing circuit arrangements respectively employing the respective improved temperature compensation circuits 134 and 362 corresponding to the schematic diagrams 400 and 410 of FIG. 4A and FIG. 4C, respectively, are different from the manner of isolation behavior exhibited by a biasing circuit arrangement employing the alternate temperature compensation circuit 342 represented by the schematic diagram 420 of FIG. 4B.

In this regard, FIG. 5 provides a graph of isolation (in decibels, dB, along the vertical axis) as a function of frequency (in Gigahertz, GHz, along the horizontal axis) and particularly shows first, second, and third curves 502, 504, and 506 showing the forward transmission (again, in dB) as a function of frequency for each of first, second, and third biasing circuit arrangements respectively employing the improved temperature compensation circuit 134, the improved temperature compensation circuit 362, and the alternate temperature compensation circuit 342, respectively (with it being assumed that other components of the respective biasing circuit arrangements other than the respective temperature compensation circuits are identical). That is the first curve 502 can be understood to represent the isolation behavior of the first biasing circuit arrangement 122 employing the improved temperature compensation circuit 134 represented by the schematic diagram 400 of FIG. 4A. Also, the second curve 504 can be understood to represent the isolation behavior of that same biasing circuit arrangement when modified to employ the improved temperature compensation circuit 362 represented by the schematic diagram 410 of FIG. 4C. Finally, the third curve 506 can be understood to represent the isolation behavior of that same biasing circuit arrangement when modified to employ the alternate temperature compensation circuit 342 represented by the schematic 420 of FIG. 4B.

Of particular note, with respect to the curves 502, 504, and 506, it can be seen that the third curve 506 pertaining to an arrangement employing the alternate temperature compensation circuit 342 exhibits a forward transmission that becomes increasingly isolated as frequency increases, in a logarithmic manner (that is, where the forward transmission loss is greatest as one attains higher and higher frequencies). In contrast, the respective forward transmission levels associated with the arrangements employing the improved temperature compensation circuits 134 and 362 respectively drop downward to respective minima 508 and 510, each at approximately 3.5 GHz, and then respectively increase upward in transmission as one proceeds to higher frequencies above 3.5 GHz. Also as shown, the arrangement employing the first improved temperature compensation circuit 134 represented by the first curve 502 experiences a lower transmission minimum of nearly negative 60 dB, and the arrangement employing the second improved temperature compensation circuit 362 experiences a somewhat lesser reduction in transmission at 3.5 GHz of about negative 40 dB. Thus, the first improved temperature compensation circuit 134, due to its relatively larger size by comparison with the second improved temperature compensation circuit 362, allow for higher levels of isolation to be achieved. It should be noted that the location, in frequency, of the minima (e.g., 508, 510) could be selected to correspond to the center frequency of operation of the amplifier, and the location could be adjusted by adjusting the inductance and capacitance values of the isolation circuits.

Figure 6:
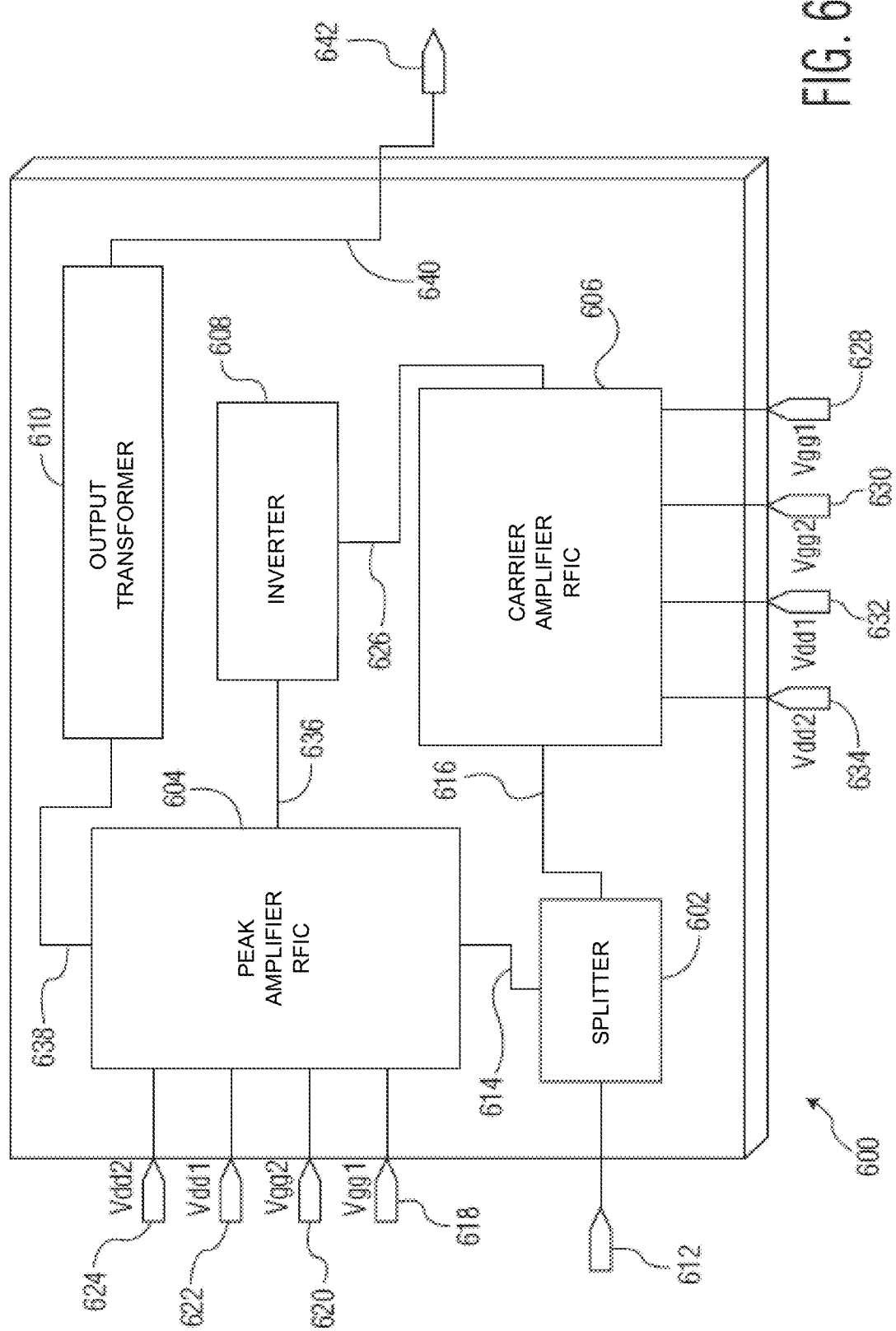
FIG. 6 is a block diagram illustrating an example Doherty power amplifier module that employs two of the two-stage RFIC power amplifiers shown in FIG. 1.

Turning to FIG. 6, it should be appreciated that power amplifiers such as the power amplifier 101 that employ one or more improved biasing circuit arrangements can be implemented in any of a variety of other circuits and systems. Indeed, any of a variety of different circuits and systems can employ improved bias isolation circuits such as those described above, and the present disclosure should be understood to encompass numerous circuit arrangements including single stage power amplifiers and other types of circuits. FIG. 6 particularly illustrates one example embodiment of a larger system or module that employs two of the power amplifiers 101 described above, in the form of a Doherty power amplifier module 600. In this example embodiment, the module 600 particularly includes a splitter 602, a first peak amplifier RFIC 604 that can take the form of the power amplifier 101, and a first carrier amplifier RFIC 606 that can also take the form of the power amplifier 101. Also, the module 600 further includes a Doherty inverter 608 coupled between the carrier amplifier RFIC 606 and the peak amplifier RFIC 604, and a Doherty output transformer 610.

Further as shown, the module 600 includes an RF input terminal 612 at which an RF signal can be received from another source, which is coupled to the splitter 602 such that the RF input signals are divided by the splitter. The splitter in turn is coupled to each of the peak and carrier amplifier RFICs 604 and 606, by way of respective conductive links 614 and 616, respectively, by which split portions of the RF input signal (or split portions of a modified version of that signal) are provided to each of the RFICs. As further illustrated, the peak amplifier RFIC 604 includes first, second, and third input ports 618, 620, and 622, corresponding to the ports 136, 138, and 128 of FIG. 1 (at which are provided the DC bias voltages $V_{gg1}$, $V_{gg2}$ and $V_{dd1}$).

Additionally, a port 624 is shown, which corresponds to the port 120 of FIG. 1 at which a drain bias voltage $V_{dd2}$ for the final-stage amplification device (e.g., device 104, 204, FIG. 2) can be input. Similarly, the carrier amplifier RFIC includes first, second, and third input ports 628, 630, and 632 corresponding to the ports 136, 138, and 128 (again at which the DC bias voltages $V_{gg1}$, $V_{gg2}$ and $V_{dd1}$ are applied), and also a port 634 corresponding to the port 120 (again at which the drain bias voltage $V_{dd2}$ can be input). The carrier amplifier RFIC 606 also outputs an RF output signal to the Doherty inverter 608 by way of a conductive link 626, and the Doherty inverter further communicates an RF output signal or a modified version of it via a conductive link 636 to the peak amplifier RFIC 604 (or to an output combination node thereof). Finally, as indicated by a conductive link 638, the combined RF output from both the Doherty inverter 608 (as provided from the carrier amplifier RFIC 606) and the peak amplifier RFIC 604 are provided via the conductive link 638 to the Doherty output transformer 610, which then outputs an RF output signal by way of a conductive link 640 to a module RF output port 642.

It should be appreciated that the present disclosure is intended to encompass a variety of additional embodiments in addition to those specifically described above or shown in FIGS. 1 through 6. As already mentioned, depending upon the embodiment, a meander line (and possibly an accompanying tap point on an extension of such a meander line) can be provided between any inductor (or inductive component) and capacitor (or capacitive component). When such a meander line is implemented in relation to the an isolation inductor and capacitor of a bias circuit (e.g., corresponding to the bias circuits 130, 132, 140, 142), it may be easier to achieve the desired performance if the bias circuit takes the form of an unbalanced, rather than balanced bias circuit as described in relation to FIG. 2. Accordingly, the present disclosure is intended to encompass embodiments involving not only balanced but also unbalanced bias circuits.

Additionally, the present disclosure is intended to encompass numerous embodiments having transmission lines or transmission line segments, or meander lines, having any of a variety of shapes and lengths (e.g., as suitable for providing desired characteristics such as transmission line characteristics discussed above involving effective inductance, phase shifting, or time delays). For example, it should be noted that, although each of FIG. 3A and FIG. 3C depicts a meander line (the meander lines 304 and 374, respectively) as having two parallel elongated transmission line portions (e.g., the portions 314 and 316 in FIG. 3A, the portions 384 and 386 in FIG. 3C), alternate embodiments of meander line could include more than two parallel elongated transmission line portions (e.g., the meander line could have an S shape with three parallel elongated portions, or could have even more than three parallel elongated portions). Also, although each of FIG. 3A and FIG. 3C depicts both of the first and second elongated portions (e.g., the portions 314 and 316 in FIG. 3A, the portions 384 and 386 in FIG. 3C) as being positioned within the space (e.g., the space 318 in FIG. 3A, the space 388 in FIG. 3C) between the capacitor and the inductor, in some alternate embodiments this need not be the case.

Figure 7:
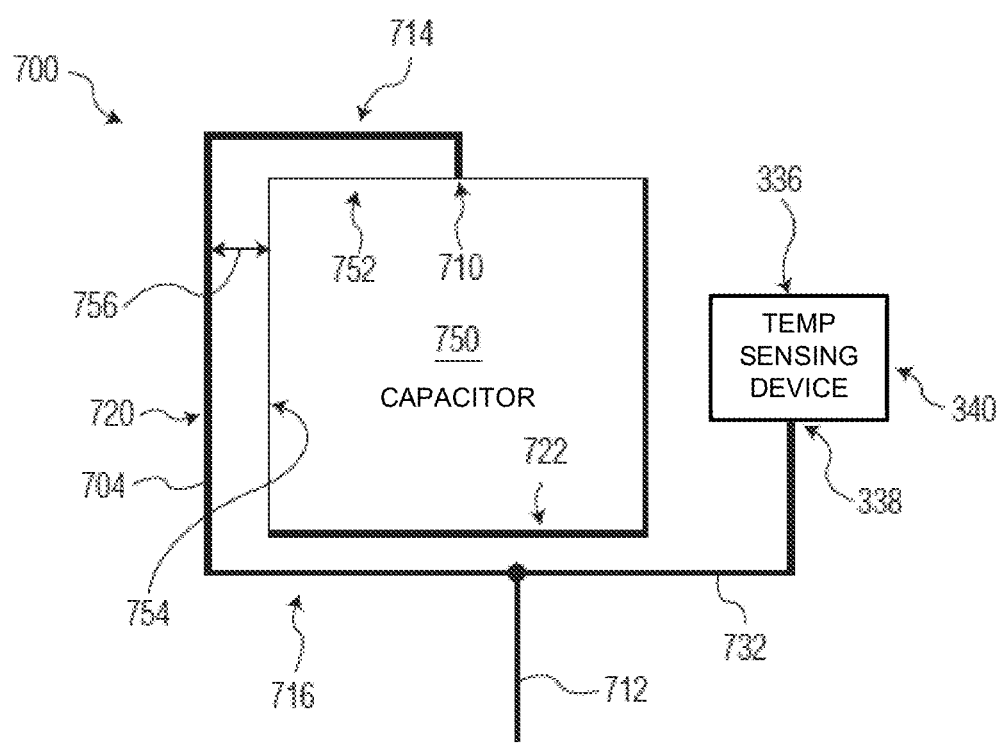
FIG. 7 is a layout diagram of a portion of an alternate example embodiment of an improved temperature compensation circuit that can form a part of a bias isolation circuit arrangement of the RFIC power amplifier of FIGS. 1 and 2.

Further in this regard, FIG. 7 shows an example alternate embodiment of a circuit portion 700 is illustrated that can take the place of a portion of the circuit shown by the layout diagram of FIG. 3A corresponding to the region 234. In this alternate embodiment, the meander line 304 and sixth capacitor 300 of FIG. 3A respectively are replaced by a meander line 704 and capacitor 750, respectively, where the meander line 704 extends from a first end 710 to a second end 712. For simplicity, FIG. 7 omits some other portions of the layout diagram of FIG. 3A, but it should be appreciated that the second end 712 in this embodiment can be coupled to the first end 306 of the sixth inductor 302 shown in FIG. 3A. More particularly, in the arrangement of FIG. 7, a first elongated portion 714 (taking the place of the first elongated portion 314) of the meander line 704 is arranged to run along a far edge 752 of the capacitor 750 rather than along a near edge 722 of the capacitor 750, along which the second elongated portion 716 of the meander line 704 runs (with it being appreciated that the near edge 722 would face the sixth inductor 302). Additionally, in the arrangement of FIG. 7, the far end 320 is replaced by a side elongated portion 720 that runs along a side edge 754 of the capacitor 750 (e.g., along the left side of the capacitor as shown in FIG. 7) and connects the first elongated portion 714 with the second elongated portion 716.

Given the arrangement shown in FIG. 7, the combination of the first, second, and side elongated portions 714, 716, and 720 of the meander line 704 effectively form a wider U-shaped (or C-shaped) meander line structure that largely wraps around the perimeter (or at least wraps around about half of the perimeter) of the capacitor 750. Further, in such an alternate embodiment, rather than the first end 310 of the meander line (at the first elongated portion 314) being coupled to the sixth capacitor 300 along the first edge 322, the first end 710 of the meander line 704 is instead coupled to the far edge 752 of the capacitor 750 that is on the opposite side of that capacitor relative to the near edge 722 (e.g., at or near a midpoint along that far edge). It should be appreciated that, in the embodiment of FIG. 7, each of the first elongated portion, second elongated portion, and side elongated portion 714, 716, and 720 of the meander line 704 can be positioned so as to run along the perimeter of the capacitor as closely as possible without being electrically in contact with the capacitor (except at the first end 710 of the meander line that is intended to be electrically coupled to the capacitor). For example, the side elongated portion 720 can be positioned a distance 756 that is 5 microns away from the side edge 754 of the capacitor 750 (also for example, although not shown in detail, the first elongated portion 714 can be positioned 5 microns from the far edge 752 and the second elongated portion 716 can be positioned 5 microns from the near edge 722).

In the embodiment of FIG. 7, the meander line 704 can again include an extension 732 by which the meander line is coupled to the temperature sensing device 340 (more particularly to the input terminal 338, where the temperature sensing device is coupled between that terminal and the output terminal 336). Although the conductive link 334 and a tap point between the extension 732 and such conductive link are not shown in detail in FIG. 7, it should be appreciated that the extension 732 is intended to represent the combination of an extension corresponding to the extension 332 and such a conductive link, as well as a tap point corresponding to the junction between those two structures. Thus, the meander line 704 can particularly be configured follow the perimeter of the capacitor 750 so as to impart the desired phase shift between such a tap point and the capacitor.

Also, in some embodiments encompassed herein, one or more of the features described above can be present even though one or more others of the features described above are absent. For example, in some other embodiments encompassed herein, an improved temperature compensation circuit can include a meander line such as any of the meander lines 304 and 374 described above except insofar as no extension is provided for coupling a tap point to the meander line. In some such other embodiments, a tap point for the temperature sensing device circuitry can again be coupled directly to a capacitor (e.g., to an edge of a plate thereof) rather than to an extension of the meander line. Also for example, in some other embodiments encompassed herein a tap point is provided on, or on an extension of, a conductive link between an inductor and capacitor, even though that conductive link lacks any U-shaped contour (and lacks any elongated portions and far end therebetween) such as that included with the meander lines 304 and 374.

Additionally, the present disclosure is also intended to encompass methods of manufacturing and operating circuits or sub-circuits (e.g., as can be part of integrated circuits), or amplifiers or other systems or modules having such circuits/sub-circuits, consistent with any of those described above. For example, the present disclosure is intended to encompass methods of operation that involve providing a biasing circuit arrangement that has the features of any of the circuits described above (and that particularly has a meander line connecting an inductor and capacitor, and/or a tap point on that meander line or otherwise on a conductive link between an inductor and capacitor), applying a bias voltage to the first terminal of a first transistor device by way of a biasing circuit arrangement, and providing a radio frequency (RF) input signal for receipt by the first terminal of the transistor device, where the biasing circuit arrangement causes the RF input signal to be isolated or substantially isolated from a further signal component associated with a presence or operation of the biasing circuit arrangement. Further, the present disclosure is intended to encompass methods of manufacturing an RFIC that includes circuits or sub-circuits (e.g., as can be part of integrated circuits), or amplifiers or other systems or modules having such circuits/sub-circuits, consistent with any of those described above. For example, the present disclosure is intended to encompass methods of manufacturing that involve forming various doped semiconductor regions (e.g., source and drain regions) in a base semiconductor substrate, and subsequently forming transistor gates and patterned conductive and dielectric layers in a build-up structure over the base semiconductor substrate, where the build-up structure includes the various circuits/sub-circuits consistent with those described above.

Additionally, in at least one example embodiment encompassed herein, the present disclosure relates to a system for providing isolation of a bias signal relative to a radio frequency (RF) signal in an integrated circuit includes an inductor, a bypass capacitor, and a transmission line segment. The bypass capacitor is spaced apart from the inductor by a first region extending a first distance along a first direction between the bypass capacitor and the inductor. The transmission line segment, includes first and second ends and extends between the first and second ends. The first end is at least indirectly coupled to the bypass capacitor, the second end is at least indirectly coupled to a first additional end of the inductor, and a second additional end of the inductor is configured to be coupled at least indirectly to a device through which the RF signal is being communicated. The transmission line segment is configured to impart a non-negligible phase shift to a signal communicated between the first and second ends, or is configured to have a non-negligible effective inductance.

Also, in at least one additional example embodiment encompassed herein, the present disclosure relates to an integrated circuit. The integrated circuit includes a first transistor device having first, second, and third terminals, a first inductor, and a first bypass capacitor spaced apart from the first inductor by a first region extending a first distance along a first direction between the first bypass capacitor and the first inductor. Additionally, the integrated circuit also includes a first transmission line segment that includes first and second ends and extends between the first and second ends, where the first end is at least indirectly coupled to the first bypass capacitor and the second end is at least indirectly coupled to a first additional end of the first inductor. Further, the first transmission line segment is configured to impart a non-negligible phase shift to a signal communicated between the first and second ends, or is configured to have a non-negligible effective inductance, and at least one of the first, second, and third terminals of the first transistor device is coupled at least indirectly to the first inductor.

Additionally, in at least one further example embodiment encompassed herein, the present disclosure relates to a power amplification system that includes an RF input terminal, a peak amplifier RF integrated circuit coupled at least indirectly to the RF input terminal, and a carrier amplifier RF integrated circuit coupled at least indirectly to the RF input terminal. Either the peak amplifier RF integrated circuit or the carrier amplifier RF integrated circuit includes a first transistor device having first, second, and third terminals, a first inductor, a first bypass capacitor, and a first transmission line segment. The first bypass capacitor is spaced apart from the first inductor by a first region extending a first distance along a first direction between the first bypass capacitor and the first inductor. Additionally, the first transmission line segment has first and second ends and at least indirectly couples the first inductor and the first bypass capacitor. Further, the first transmission line segment is configured to have a non-negligible effective inductance, and has an electrical length between the first and second ends that is sufficient to impart a non-negligible signal delay to a signal communicated between the first and second ends.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A system for providing isolation of a bias signal relative to a radio frequency (RF) signal in an integrated circuit, the system comprising:
   an inductor;
   a bypass capacitor spaced apart from the inductor by a first region extending a first distance along a first direction between the bypass capacitor and the inductor; and
   a transmission line segment,
   wherein the transmission line segment includes first and second ends and extends between the first and second ends,
   wherein the first end is at least indirectly coupled to the bypass capacitor and the second end is at least indirectly coupled to a first additional end of the inductor, wherein a second additional end of the inductor is configured to be coupled at least indirectly to a device through which the RF signal is being communicated, and
   wherein the transmission line segment is configured to impart a non-negligible phase shift to a signal communicated between the first and second ends, or is configured to have a non-negligible effective inductance.

2. The system of claim 1, wherein the transmission line segment has an electrical length between first and second ends that is sufficient to impart a non-negligible signal delay to the signal communicated between the first and second ends.

3. The system of claim 1, wherein the transmission line segment is a meander line that includes a plurality of parallel-oriented, electrically-coupled, and electromagnetically-coupled transmission line portions between the first and second ends.

4. The system of claim 1, wherein the transmission line segment is a meander line that includes a U-shaped structure extending between the first end and the second end, wherein the U-shaped structure includes a first elongated portion and a second elongated portion that respectively extend longitudinally away from the first end and the second end, respectively, and wherein the U-shaped structure additionally includes a far end or side elongated portion by way of which the first and second elongated portions are interconnected.

5. The system of claim 4, wherein the meander line is entirely or substantially entirely positioned within the first region between the inductor and the bypass capacitor.

6. The system of claim 4, wherein the bypass capacitor includes a first edge, a second edge, and a side edge extending between the first edge and the second edge, wherein the second edge faces the first region, wherein the first elongated portion is positioned so as to extend along the first edge, wherein the second elongated portion is positioned so as to extend along the second edge, wherein the side elongated portion is positioned so as to extend along the side edge, wherein the first end couples the first elongated portion to the first edge or a location proximate the first edge, and wherein the U-shaped structure wraps around a portion of the perimeter of the bypass capacitor.

7. The system of claim 4, wherein the second elongated portion of the meander line not only extends from the second end to the far end, parallel to the first elongated portion, but also includes an extension that extends to a tap point at which a further device or a line linked at least indirectly to the further device can be coupled.

8. The system of claim 1, wherein the inductor is a spiral inductor including a plurality of spiral paths and extending between the first additional end and a second additional end.

9. The system of claim 1, wherein the bypass capacitor is a metal oxide semiconductor (MOS) capacitor and is connected to a ground reference by way of at least four through-substrate vias (TSVs).

10. The system of claim 1, wherein the transmission line segment includes an extension that extends to a tap point at which a further device or a line linked at least indirectly to the further device can be coupled.

11. The system of claim 10, further comprising the further device, wherein the further device is a temperature compensation diode or a temperature compensation transistor, and wherein the system is a temperature compensation circuit portion of a bias isolation circuit portion.

12. An integrated circuit comprising:
a first transistor device having first, second, and third terminals;
a first inductor;
a first bypass capacitor spaced apart from the first inductor by a first region extending a first distance along a first direction between the first bypass capacitor and the first inductor; and
a first transmission line segment,
wherein the first transmission line segment includes first and second ends and extends between the first and second ends,
wherein the first end is at least indirectly coupled to the first bypass capacitor and the second end is at least indirectly coupled to a first additional end of the first inductor, wherein the first transmission line segment is configured to impart a non-negligible phase shift to a signal communicated between the first and second ends, or is configured to have a non-negligible effective inductance, and
wherein at least one of the first, second, and third terminals of the first transistor device is coupled at least indirectly to the first inductor.

13. The integrated circuit of claim 12, wherein the first transistor device is a field effect transistor (FET).

14. The integrated circuit of claim 12, wherein the transmission line segment is configured to impart the non-negligible phase shift to the signal communicated between the first and second ends, is configured to have the non-negligible effective inductance, and has an electrical length between first and second ends that is sufficient to impart a non-negligible signal delay to the signal communicated between the first and second ends.

15. The integrated circuit of claim 12, wherein the transmission line segment is a meander line that includes a U-shaped structure extending between the first end and the second end, and additionally includes an extension that extends to a tap point.

16. The integrated circuit of claim 15, wherein the integrated circuit includes a biasing circuit arrangement that includes a first bias circuit portion and also a first temperature compensation circuit portion, wherein the first temperature compensation circuit portion includes each of the first inductor, the first bypass capacitor, and the first transmission line segment, wherein a further device or a line linked at least indirectly to the further device is coupled to the tap point, and wherein the first bias circuit portion is coupled at least indirectly between the first transistor device and first inductor.

17. The integrated circuit of claim 16, further comprising a bias voltage port at which a bias voltage is received by the integrated circuit, and wherein the bias voltage port is electrically coupled, at least indirectly, with the first bias circuit portion.

18. The integrated circuit of claim 17, further comprising:
a second transistor device having fourth, fifth and sixth terminals;
a second inductor;
a second bypass capacitor that is at least indirectly coupled to the second inductor,
wherein at least one of the fourth, fifth, and sixth terminals of the second transistor device is coupled at least indirectly to the second inductor, and
wherein the second terminal is electrically coupled, at least indirectly, to the fourth terminal, so that an output RF signal provided by the first transistor at the second terminal is provided, or provided in a modified form, to the second transistor.

19. A power amplification system comprising:
an RF input terminal;
a peak amplifier RF integrated circuit coupled at least indirectly to the RF input terminal;
a carrier amplifier RF integrated circuit coupled at least indirectly to the RF input terminal,
wherein either the peak amplifier RF integrated circuit or the carrier amplifier RF integrated circuit includes:
a first transistor device having first, second, and third terminals;
a first inductor;

a first bypass capacitor spaced apart from the first inductor by a first region extending a first distance along a first direction between the first bypass capacitor and the first inductor; and a first transmission line segment having first and second ends and at least indirectly coupling the first inductor and the first bypass capacitor, wherein the first transmission line segment is configured to have a non-negligible effective inductance, and has an electrical length between the first and second ends that is sufficient to impart a non-negligible signal delay to a signal communicated between the first and second ends.

20. The system of claim 19, wherein the first transmission line segment is a meander line that includes a plurality of parallel-oriented, electrically-coupled, and electromagnetically-coupled transmission line portions between the first and second ends, and additionally includes an extension that extends to a tap point.

* * * * *